US009303970B2

United States Patent
Furushima

(10) Patent No.: US 9,303,970 B2
(45) Date of Patent: Apr. 5, 2016

(54) SHAPE MEASURING INSTRUMENT, IMPEDANCE DETECTOR, AND IMPEDANCE DETECTION METHOD

(71) Applicant: MITUTOYO CORPORATION, Kanagawa (JP)

(72) Inventor: Hiromitsu Furushima, Kawasaki (JP)

(73) Assignee: MITUTOYO CORPORATION, Kanagawa (JP)

( * ) Notice: Subject to any disclaimer, the term of this patent is extended or adjusted under 35 U.S.C. 154(b) by 409 days.

(21) Appl. No.: 14/066,791

(22) Filed: Oct. 30, 2013

(65) Prior Publication Data

US 2014/0123509 A1 May 8, 2014

(30) Foreign Application Priority Data

Nov. 7, 2012 (JP) ................................ 2012-245582

(51) Int. Cl.
*G01B 7/28* (2006.01)
*G01B 7/012* (2006.01)
*G01R 27/04* (2006.01)

(52) U.S. Cl.
CPC ........ *G01B 7/28* (2013.01); *G01B 7/012* (2013.01); *G01R 27/04* (2013.01)

(58) Field of Classification Search
CPC .......... G01B 5/008; G01B 7/012; G01B 7/28; G01B 21/04; G01B 21/045; G01R 27/02; G01R 27/04; G01R 27/16; G01R 31/02; G01R 31/021
USPC ................... 33/503; 324/527, 539, 542, 543; 702/168
See application file for complete search history.

(56) References Cited

U.S. PATENT DOCUMENTS

| 7,068,043 | B1* | 6/2006 | Lo | H04L 1/248 324/533 |
| 7,512,503 | B2* | 3/2009 | Bechhoefer | G01R 31/11 702/58 |
| 7,561,980 | B2* | 7/2009 | Yen | H04L 1/244 324/533 |
| 8,339,129 | B2* | 12/2012 | Huggett | G01H 1/003 324/239 |
| 2008/0077158 | A1* | 3/2008 | Haider | A61B 17/14 606/130 |
| 2010/0207619 | A1* | 8/2010 | Wu | G01B 7/008 324/238 |

FOREIGN PATENT DOCUMENTS

| EP | 2199733 A1 * | 6/2010 | ............. B82Y 35/00 |
| JP | 2007-333674 A | 12/2007 | |
| WO | WO 9528615 A1 * | 10/1995 | ............. B23Q 17/24 |

OTHER PUBLICATIONS

English machine translation of Claims and Description for JP 2007-333674 A as provided by the JPO on Feb. 4, 2016, 24 pages total, entire document is pertinent.*

* cited by examiner

*Primary Examiner* — R. A. Smith
(74) *Attorney, Agent, or Firm* — Greenblum & Bernstein, P.L.C.

(57) ABSTRACT

A coordinate measuring device includes a probe detecting a shape of a measured object and outputting a signal indicating results of the shape detection. A probe interface receives the signal indicating the results of the shape detection. A cable transmits the signal indicating the results of the shape detection between the probe and the probe interface and bends accompanying displacement of the probe. The probe interface includes an impedance detector having a calculator detecting impedance in the cable. The impedance detector transmits high-speed test data to the probe through the cable and detects impedance in the cable according to whether a reception confirmation signal output by the probe is received.

25 Claims, 10 Drawing Sheets

SHAPE MEASURING INSTRUMENT, IMPEDANCE DETECTOR, AND IMPEDANCE DETECTION METHOD

CROSS-REFERENCE TO RELATED APPLICATIONS

The present application claims priority under 35 U.S.C. §119 of Japanese Application No. 2012-245582, filed on Nov. 7, 2012, the disclosure of which is expressly incorporated by reference herein in its entirety.

BACKGROUND OF THE INVENTION

1. Field of the Invention

The present invention relates to a shape measuring instrument, an impedance detector, and an impedance detection method. For example, the present invention relates to a shape measuring instrument, an impedance detector, and an impedance detection method that detect impedance in a cable having a bent portion and connected to a movable portion.

2. Description of Related Art

Nowadays, in order to test accuracy of processing on a manufactured item having a three-dimensional shape, a shape measurer such as a coordinate measuring device is used. A coordinate measuring device of this kind performs shape measurement by displacing a probe mounted on a non-contact measurer along the three-dimensional shape. When such shape measurement is conducted for a long period of time, impedance increases due to repeatedly bending a cable connected to the probe. The cable is chiefly configured by electric wires made of metal. When metal having a high degree of purity is repeatedly deformed within its range of elastic deformation, no distortion is caused in a metallic crystalline structure thereof. However, in an actual cable, when deformation is repeated a large number of times, even within the range of elastic deformation, distortion gradually accrues, caused by the metallic crystalline structure, which contains impurities. As a result, impedance in the cable increases. For example, in a coordinate measuring device that transfers image data, data transfer becomes impossible due to the increased impedance in the cable.

In order to resolve the above-noted issues, a technique has been suggested in which impedance is reviewed by a signal wire conduction check in a case where a contact measurer is mounted on a probe (Japanese Patent Laid-open Publication No. 2007-333674). The technique discloses performing the impedance review using a dedicated testing tool.

However, the inventor of the present invention has discovered an issue with respect to the above-noted technique. The above-noted technique requires the dedicated testing tool. Therefore, the impedance review cannot be performed readily, which causes costs to increase.

SUMMARY OF THE INVENTION

An aspect of the present invention is a shape measuring instrument including a measuring device (measurer), a control device (controller), and a cable. The measuring device includes a movable detector detecting a shape of a measured object and outputting a signal indicating results of the shape detection. The control device receives the signal indicating the results of the shape detection. The cable transmits the signal indicating the results of the shape detection between the movable detector and the control device and bends accompanying displacement of the movable detector. The control device includes an impedance detector detecting impedance in the cable. The impedance detector includes a calculator detecting the impedance in the cable according to whether a reception confirmation signal is received through the cable, the reception confirmation signal being output from the movable detector when test data is transmitted through the cable to the movable detector and the movable detector receives the test data.

Another aspect of the present invention is the shape measuring instrument, wherein the calculator outputs the test data to the movable detector N times (where N is an integer equal to or greater than 1), outputs a pass determination when the reception confirmation signal is received at least M times (where M is an integer equal to or greater than 1 and equal to or less than N), and outputs a fail determination when the reception confirmation signal is received less than M times (where M is an integer equal to or greater than 1 and equal to or less than N).

Another aspect of the present invention is the shape measuring instrument, wherein the impedance detector further includes a counter controlling a number of times the test data output from the calculator is output, and a memory storing information indicating a number of times the reception confirmation signal output from the calculator is received.

Another aspect of the present invention is the shape measuring instrument, wherein the calculator includes a test data outputter outputting the test data to the movable detector; a signal reception verifier confirming whether the reception confirmation signal is received; a count value controller controlling a value defined by the counter; a calculator calculating the number of times the reception confirmation signal is received; and a determiner determining whether the number of times the reception confirmation signal is received is equal to or greater than M based on the information stored in the memory.

Another aspect of the present invention is the shape measuring instrument, wherein a communication speed of the test data transmitted from the control device, through the cable, and to the movable detector is faster than a communication speed of a signal transmitted from the movable detector, through the cable, and to the control device when performing a shape measurement.

Another aspect of the present invention is the shape measuring instrument including a plurality of the cables. The communication speed of the signal indicating the results of the shape detection transmitted from the movable detector, through the plurality of cables, and to the calculator differs for each of the plurality of cables. The communication speed of the test data transmitted from the calculator, through the plurality of cables, and to the movable detector differs for each of the plurality of cables.

Another aspect of the present invention is the shape measuring instrument, wherein the cable is a bundled cable including a first through third cables. The signal indicating the results of the shape detection is transmitted from the movable detector, through the first cable, and to the calculator. The test data is transmitted from the calculator, through the second cable, and to the movable detector. A connection end of the second cable on the movable detector side and a connection end of the third cable on the movable detector side are short-circuited. The test data is transmitted from the movable detector, through the second cable, and to the calculator as the reception confirmation signal. Impedance detection results for the second and third cables are output as impedance results for the first cable.

Another aspect of the present invention is the shape measuring instrument, wherein the calculator detects the impedance in the first cable before the measuring device begins a shape measurement operation.

Another aspect of the present invention is the shape measuring instrument, wherein the calculator detects the impedance in the cables after the measuring device begins the shape measurement operation, during a time when the movable detector is displaced from a first measurement position to a second measurement position without performing shape measurement.

Another aspect of the present invention is an impedance detector including a calculator. The calculator outputs test data through a cable to a movable portion of an instrument having the movable portion, the movable portion outputting a signal indicating results of an operation and the cable being bent accompanying displacement of the movable portion. The calculator detects impedance in the cable according to whether a reception confirmation signal output when the movable portion receives the test data is confirmed to be received through the cable.

Another aspect of the present invention is the impedance detector, wherein the calculator outputs the test data to the movable portion N times (where N is an integer equal to or greater than 1), outputs a pass determination when the reception confirmation signal is received at least M times (where M is an integer equal to or greater than 1 and equal to or less than N), and outputs a fail determination when the reception confirmation signal is received less than M times (where M is an integer equal to or greater than 1 and equal to or less than N).

Another aspect of the present invention is the impedance detector, wherein the impedance detector further includes a counter controlling a number of times the test data output from the calculator is output, and a memory storing information indicating a number of times the reception confirmation signal output from the calculator is received.

Another aspect of the present invention is the impedance detector, wherein the calculator includes a test data outputter outputting the test data to the movable portion; a signal reception verifier confirming whether the reception confirmation signal is received; a count value controller controlling a value defined by the counter; a calculator calculating a number of times the reception confirmation signal is received; and a determiner determining whether the number of times the reception confirmation signal is received is equal to or greater than M based on the information stored in the memory.

Another aspect of the present invention is the impedance detector, wherein a communication speed of the test data transmitted from the calculator, through the cable, and to the movable portion is faster than a communication speed of the signal indicating the results of the operation and transmitted from the movable portion, through the cable, and to the control device of the instrument having the movable portion.

Another aspect of the present invention is the impedance detector including a plurality of the cables. The communication speed of the signal indicating the results of the operation and transmitted from the movable portion, through the plurality of cables, and to the control device of the instrument having the movable portion differs for each of the plurality of cables. The communication speed of the test data transmitted from the control device, through the plurality of cables, and to the movable portion differs for each of the plurality of cables.

Another aspect of the present invention is the impedance detector, wherein the cable is a bundled cable including a first through third cables. The signal indicating results of shape detection is transmitted from the movable portion, through the first cable, and to the calculator. The test data is transmitted from the calculator, through the second cable, and to the movable portion. A connection end of the second cable on the movable portion side and a connection end of the third cable on the movable portion side are short-circuited. The test data is transmitted from the movable portion, through the second cable, and to the calculator as the reception confirmation signal. Impedance detection results for the second and third cables are output as impedance results for the first cable.

Another aspect of the present invention is the impedance detector, wherein the calculator detects the impedance in the cables before the movable portion begins an operation outputting the signal indicating results of an operation.

Another aspect of the present invention is the impedance detector, wherein the calculator detects the impedance in the cables after the movable portion begins the operation outputting the signal indicating the results of the operation, during a time when the movable portion is displaced from a first measurement position to a second measurement position without outputting the signal indicating the results of the operation.

Another aspect of the present invention is an impedance detection method that includes outputting test data through a cable to a movable portion of an instrument having the movable portion, the movable portion outputting a signal indicating results of an operation and the cable being bent accompanying displacement of the movable portion; confirming whether a reception confirmation signal is received, the signal being output when the movable portion receives the test data is confirmed; and detecting impedance in the cable according to a result of the confirmation.

Another aspect of the present invention is the impedance detection method that includes outputting the test data to the movable portion N times (where N is an integer equal to or greater than 1); outputting a pass determination when the reception confirmation signal is received at least M times (where M is an integer equal to or greater than 1 and equal to or less than N); and outputting a fail determination when the reception confirmation signal is received less than M times (where M is an integer equal to or greater than 1 and equal to or less than N).

Another aspect of the present invention is the impedance detection method, wherein a communication speed of the test data transmitted through the cable to the movable portion is faster than a communication speed of the signal indicating results of an operation and transmitted from the movable portion through the cable.

Another aspect of the present invention is the impedance detection method, wherein the communication speed of the signal indicating the results of the operation and transmitted from the movable portion through a plurality of the cables differs for each of the plurality of cables. The communication speed of the test data transmitted through the plurality of cables to the movable portion differs for each of the plurality of cables.

Another aspect of the present invention is the impedance detection method, wherein the cable is a bundled cable including a first through third cables. The signal indicating results of shape detection is transmitted from the movable portion through the first cable. The test data is transmitted through the second cable to the movable portion. A connection end of the second cable on the movable portion side and a connection end of the third cable on the movable portion side are short-circuited. The test data is transmitted from the movable portion through the second cable as the reception confirmation signal. Impedance detection results for the second and third cables are output as impedance results for the first cable.

Another aspect of the present invention is the impedance detection method, wherein the impedance in the cables is detected before the movable portion begins an operation outputting the signal indicating the results of the operation.

Another aspect of the present invention is the impedance detection method, wherein the impedance in the cables is detected after the movable portion begins the operation outputting the signal indicating the results of the operation, during a time when the movable portion is displaced from a first measurement position to a second measurement position without outputting the signal indicating the results of the operation.

According to the present invention, impedance can be readily detected in a cable connected to a movable portion and having a bent portion.

The present invention is clarified by the following detailed description and the appended drawings. The appended drawings are referenced only to facilitate understanding and do not serve to limit the present invention.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE INVENTION

Figure 1:
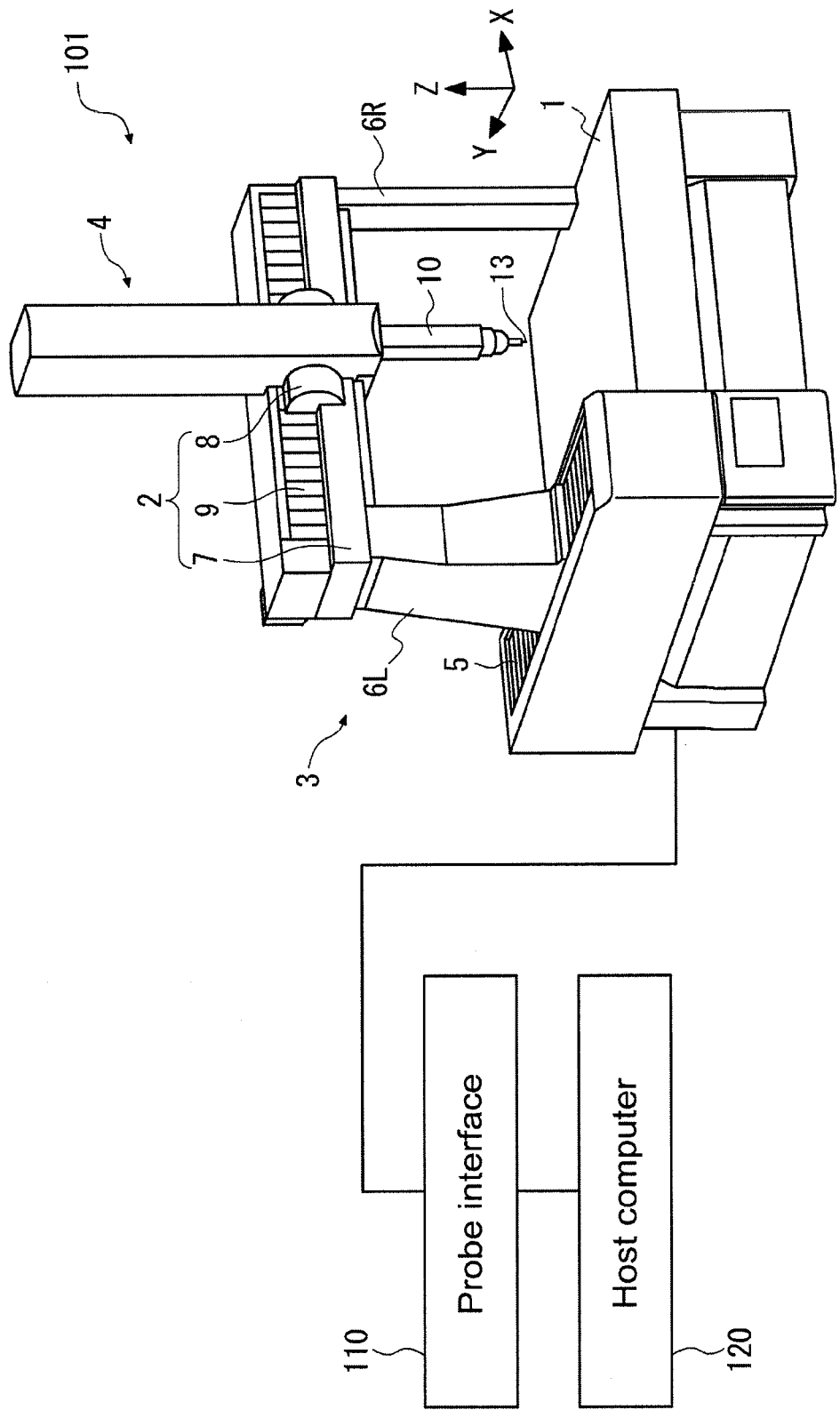
FIG. 1 is a perspective view schematically illustrating a configuration of a shape measuring instrument 100 according to Embodiment 1.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the forms of the present invention may be embodied in practice.

Hereafter, embodiments of the present invention are described with reference to the drawings. Identical reference numerals are assigned to identical elements in each of the plurality of drawings, and thus duplicative descriptions are omitted where necessary.

Embodiment 1

First, a description is given of a shape measuring instrument 100 according to Embodiment 1. FIG. 1 schematically illustrates a configuration of the shape measuring instrument 100 according to Embodiment 1. The shape measuring instrument 100 includes a coordinate measuring device 101, a probe interface 110, and a host computer 120. Hereafter, the probe interface 110 is also referred to as a control device. The coordinate measuring device is also referred to simply as a measuring device.

The coordinate measuring device 101 includes a displacement mechanism provided on a table 1, the displacement mechanism displacing a probe 13. A work piece is placed on the table 1. Hereafter, the probe 13 is also referred to as a movable detector or as a movable portion. The displacement mechanism is configured by an X-direction drive mechanism 2, a Y-direction drive mechanism 3, and a Z-direction drive mechanism 4. The X-direction drive mechanism 2 displaces the probe 13 in an X direction. The Y-direction drive mechanism 3 displaces the probe 13 in a Y direction. The Z-direction drive mechanism 4 displaces the probe 13 in a Z direction.

The table 1 has a quadrangular pillar shape and includes a top surface processed to precision flatness for the purpose of placing the work piece thereon. For purposes of description, two mutually orthogonal directions on the top surface of the table 1 are designated as the X direction (left-right direction) and the Y direction (front-back direction), respectively. In addition, a direction perpendicular to the top surface of the table 1 is designated as the Z direction (vertical direction).

The X-direction drive mechanism 2 is configured with an X beam 7, an X slider 8, and an X slider driver 9. The X beam 7 is a rectangular guide member supported at two ends by a Y slider 6L and a Y slider 6R. The X beam 7 is driven by the Y-direction drive mechanism 3 to move in the Y direction. The X slider 8 is a movable member provided so as to be capable of displacing along a longitudinal direction of the X beam 7. The X slider driver 9 displaces the X slider 8. An air bearing is provided between the X slider 8 and the X beam 7; however, a detailed description thereof is omitted.

The Y-direction drive mechanism 3 is configured by a Y guide rail 5, the Y slider 6L, and the Y slider 6R. The Y guide rail 5 is provided on the table 1 in the Y direction. The Y slider 6L is provided so as to be capable of displacing along the Y guide rail 5. The Y slider 6R is paired with the Y slider 6L and displaces above the table 1 in the Y direction. Air bearings are provided between the Y guide rail 5 and the Y slider 6L, as well as between the table 1 and the Y slider 6R; however, a detailed description thereof is omitted.

The coordinate measuring device 101 is connected to the probe interface 110. In response to a command from the host computer 120, the probe interface 110 controls operations of the coordinate measuring device 101 and performs shape measurement by detecting a signal from the probe 13.

Figure 2:
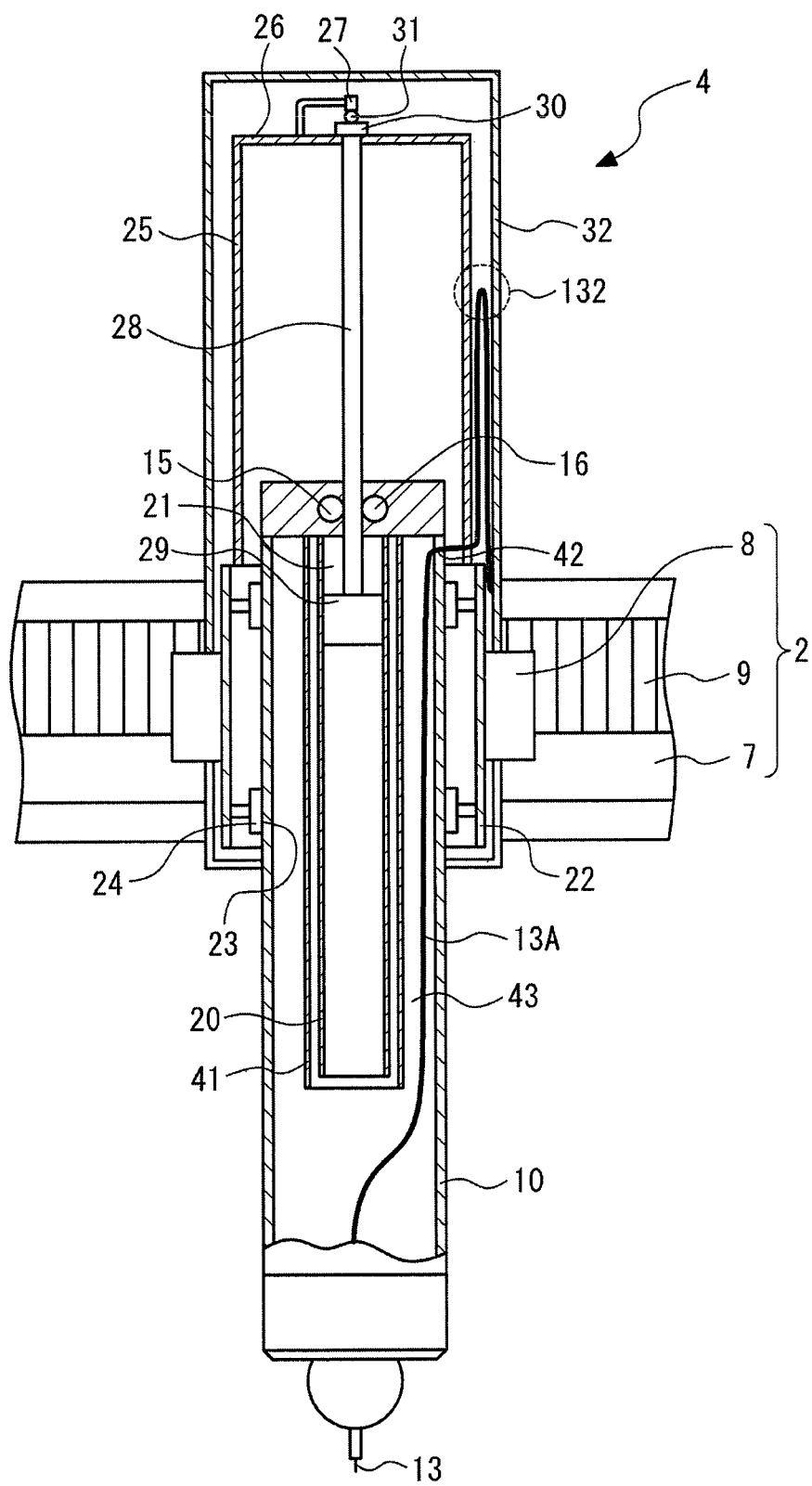
FIG. 2 is a cross-sectional view schematically illustrating a configuration of a Z-direction drive mechanism 4.

FIG. 2 is a cross-sectional view schematically illustrating a configuration of the Z-direction drive mechanism 4. A Z-axis spindle 10 has an interior formed in a hollow, squared tube shape and is guided in the perpendicular direction by a guide tube 22. A bottom end of the Z-axis spindle 10 includes the probe 13 for contacting the work piece and measuring at least one of a position and coordinates of the work piece. The guide tube 22 is provided on the X slider 8 oriented such that a tube opening faces the perpendicular direction. The Z-axis spindle 10 is inserted into an interior of the guide tube 22 so as to be capable of raising and lowering in the vertical direction. In addition, the guide tube 22 supports the Z-axis spindle 10 via an air bearing 23 formed by an air pad 24. The air bearing 23 is configured by providing the air pad 24 to the tube opening of the guide tube 22 and expelling a jet of air from the air pad 24 onto a sliding surface (exterior surface) of the Z-axis spindle 10.

A top end of a support shaft 28 is supported on a support column 25 provided upright in the guide tube 22. The support column 25 includes a crossbeam 26 at a height at least a displacement amount of the Z-axis spindle 10 away from the guide tube 22. An aperture is provided at an intersection of the crossbeam 26 and a displacement axis of the Z-axis spindle 10. The top end of the support shaft 28 is inserted through the aperture in the crossbeam 26 and includes a flange 30 having a surface orthogonal to the support shaft 28. A ball 31 is provided on a top surface of the flange 30 and configures a bearing with a bearing piece 27 on the support column 25. The top end of the support shaft 28 is thus supported in a manner capable of oscillation.

A drive roller 15 and a driven roller 16 are provided so as to sandwich the support shaft 28 therebetween. The drive roller 15 and the driven roller 16 sandwich the support shaft 28 with a predetermined pressing strength. Thereby, a configuration is achieved in which the drive roller 15 and the driven roller 16 do not idle against the support shaft 28 due to a friction force arising between the support shaft 28 and the drive roller 15 and the driven roller 16. The drive roller 15 revolves by receiving power from a motor (not illustrated), however a detailed description thereof is omitted.

A cylinder 20 is provided along the vertical direction of the Z-axis spindle 10 on the interior of the Z-axis spindle 10. A piston 29 is slidably housed within the cylinder 20. An upper region in a space inside the cylinder 20 demarcated by the piston 29 (i.e., a region on the support shaft 28 side) is a push-up power generating chamber 21. The push-up power generating chamber 21 includes an air jet aperture (not illustrated) supplying air to an interior of the push-up power generating chamber 21. Air is supplied to the push-up power generating chamber 21 such that internal pressure of the push-up power generating chamber 21 has a pressure force sufficient to generate push-up power commensurate with a weight of the Z-axis spindle 10.

A protective tube 41 is provided on an exterior of the cylinder 20, covering an exterior surface of the cylinder 20. The protective tube 41 has a tubular shape of a size to allow a slight gap between the protective tube 41 and the exterior surface of the cylinder 20. A top end of the protective tube 41 is coupled and fixated to the Z-axis spindle 10. A guide path 43 is formed on an upper portion of the Z-axis spindle 10, the guide path 43 guiding a cable 13A from the probe 13 to an extraction outlet 42 formed on a top end of the Z-axis spindle 10 in order to extract the cable 13A. The guide path 43 is formed in the gap between the exterior surface of the protective tube 41 and the interior surface of the Z-axis spindle 10 to allow passage of the cable 13A from the probe 13. The cable 13A is flexible and is guided from the probe 13, through the guide path 43 and the extraction outlet 42, to an exterior of the Z-axis spindle 10 without touching the cylinder 20.

After being extracted from the extraction outlet 42 at the top end of the Z-axis spindle 10 to the exterior of the Z-axis spindle 10, the cable 13A snakes a predetermined distance within a housing 32. A bent portion 132 is thus created in the cable 13A. Moreover, the cable 13A is then inserted within the X beam 7 and connected to a predetermined circuit.

In the coordinate measuring device 101, the work piece is first placed on the table 1 in order to measure at least one of the position and coordinates of the work piece. Next, the probe 13 is displaced by the X-direction drive mechanism 2, the Y-direction drive mechanism 3, and the Z-direction drive mechanism 4 to bring the probe 13 into contact with the work piece. By recording the position of the probe 13, at least one of the position and the coordinates of the work piece can be measured.

When the Z-direction drive mechanism 4 is driven, the drive roller 15 is rotated. The support shaft 28 is between the drive roller 15 and the driven roller 16, and therefore the drive roller 15 and the driven roller 16 are displaced along the support shaft 28 by the force of friction. When the drive roller 15 and the driven roller 16 are displaced, the Z-axis spindle 10 is guided by the guide tube 22 while being raised and lowered in the vertical direction. As a result, the probe 13 can be raised and lowered in the vertical direction.

When the probe 13 is raised and lowered in the vertical direction, the cable 13A extracted to the exterior of the Z-axis spindle 10 has flexibility, and therefore the bent portion 132 also displaces vertically. In other words, repeating measurement repeats the vertical movement of the bent portion 132. As a result, a conductive wire inside the cable 13A is repeatedly deformed and impedance increases.

Figure 3:
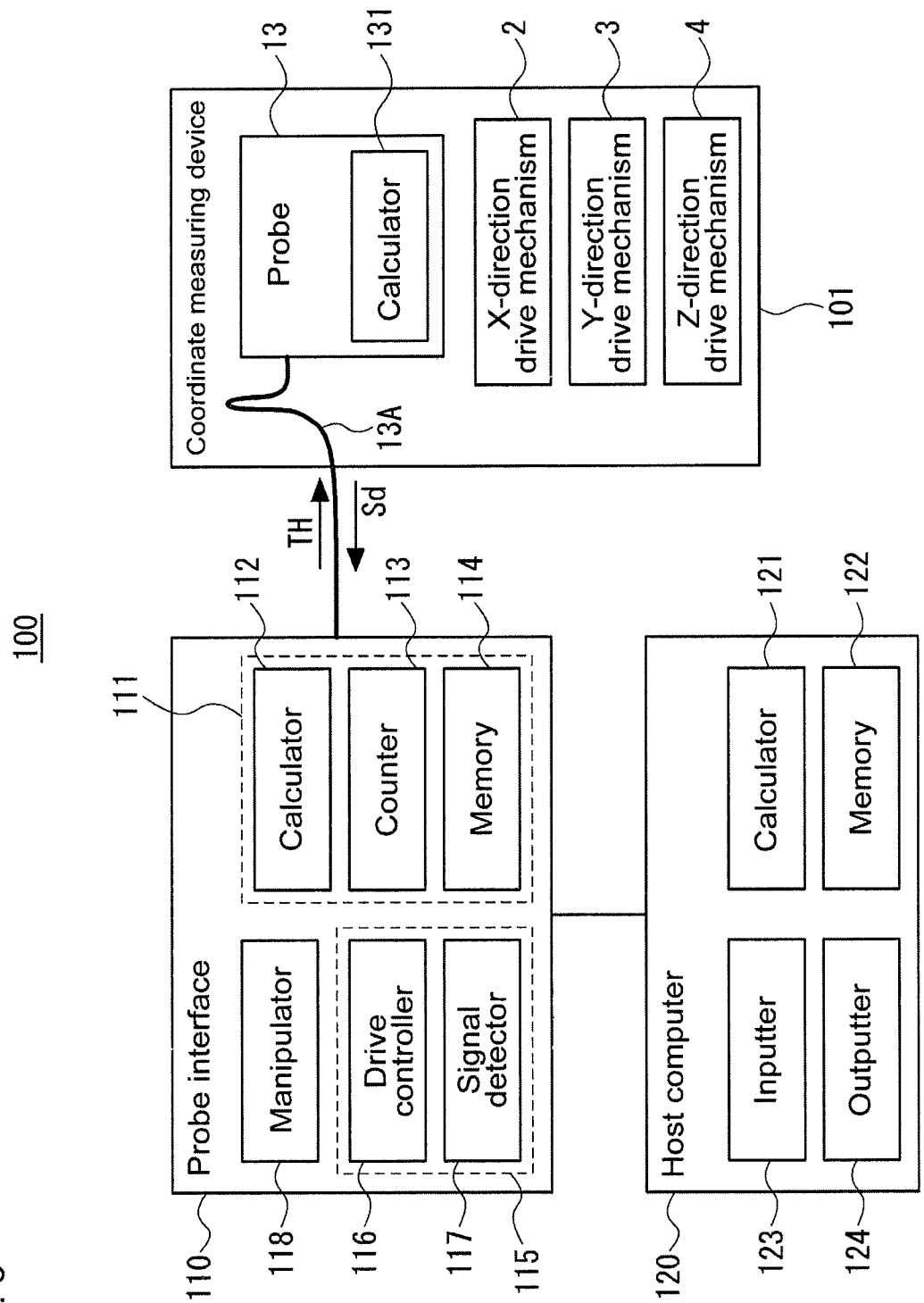
FIG. 3 is a block diagram schematically illustrating the configuration of the shape measuring instrument 100 according to Embodiment 1.

FIG. 3 is a block diagram schematically illustrating the configuration of the shape measuring instrument 100 according to Embodiment 1. In order to simplify the drawing, FIG. 3 shows only the X-direction drive mechanism 2, the Y-direction drive mechanism 3, the Z-direction drive mechanism 4, and the probe 13 of the coordinate measuring device 101. The probe 13 includes a calculator 131. The calculator 131 is capable of outputting a signal in response to a signal input from an exterior of the probe 13.

The probe interface 110 includes an impedance detector 111, a measurement controller 115, and a manipulator 118. The impedance detector 111 performs a test operation for impedance in a cable of the coordinate measuring device 101.

The impedance detector 111 includes a calculator 112, a counter 113, and a memory 114. The calculator 112 controls the test operation for impedance in the cable of the coordinate measuring device 101 according to a command of the host computer 120. The counter 113 keeps a count of a value according to a command of the calculator 112. The memory 114 stores information regarding the test operation for impedance in the cable of the coordinate measuring device 101 and is configured so as to be capable of executing data read/write with the calculator 112. The memory 114 can employ an HDD, for example.

The measurement controller 115 includes a drive controller 116 and a signal detector 117. The drive controller 116 controls the X-direction drive mechanism 2, the Y-direction drive mechanism 3, and the Z-direction drive mechanism 4 (displacement mechanisms) based on a drive command signal input when the manipulator 118 is operated or on a drive command signal input from the host computer 120. In addition, the drive controller 116 outputs an operation signal to the host computer 120 when the manipulator 118 is operated.

The signal detector 117 detects the signal output from the probe 13 and through the cable 13A, then detects and outputs to the host computer 120 a displacement amount of the displacement mechanism.

The manipulator 118 is configured by a joystick, for example, and the probe 13 can be manually displaced by operating the manipulator 118.

The host computer 120 includes a calculator 121, a memory 122, an inputter 123, and an outputter 124. The calculator 121 is configured with a CPU (Central Processing Unit) or the like and, by providing a predetermined command to the probe interface 110, controls operations of the coordinate measuring device 101. Thereby, a test operation for impedance in the cable or a measurement operation measuring the shape of the work piece by displacing the probe 13 along the surface of the work piece with the displacement mechanism can be performed.

The memory 122 stores a program controlling a shape measurement operation of the coordinate measuring device 101, a program controlling the test operation for impedance in the cable, and the like. The memory 122 is configured so as to be capable of executing data read/write with the calculator 121. The memory 122 can employ an HDD, for example.

The inputter 123 is configured with a keyboard, a CD-ROM drive, and the like, for example. Via the inputter 123, a command can be given to the calculator 121 and information can be written to the memory 122. The outputter 124 is configured with a monitor, for example, and can display results of a shape measurement and a test operation according to a command of the calculator 121.

Figure 4:
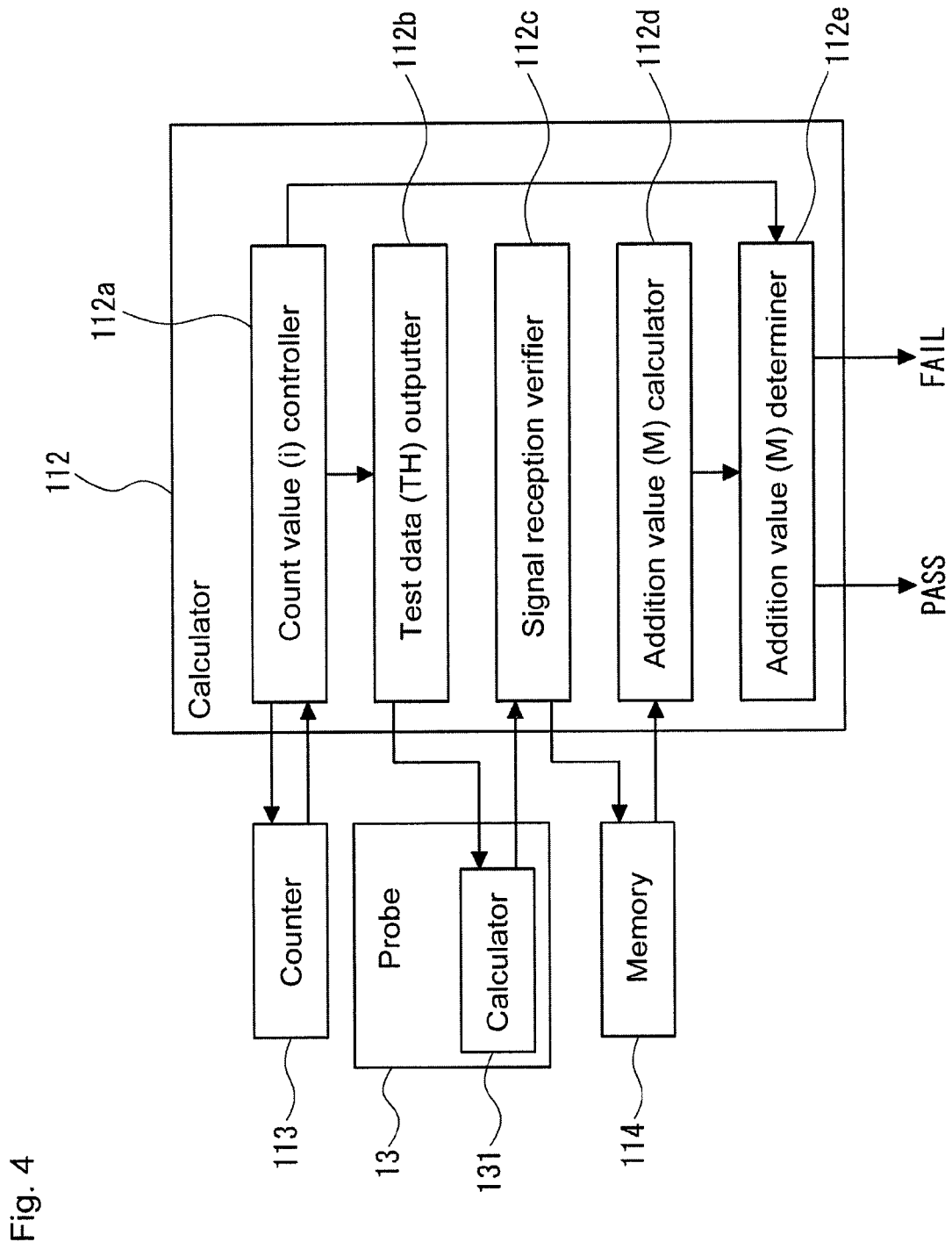
FIG. 4 is a block diagram schematically illustrating a configuration of a calculator 112.

Next, a configuration of the calculator 112 is described. FIG. 4 is a block diagram schematically illustrating the configuration of the calculator 112. The calculator 112 includes a count value controller 112a, a test data outputter 112b, a signal reception verifier 112c, an addition value calculator 112d, and an addition value determiner 112e.

The count value controller 112a controls a counting operation of the counter 113. The test data outputter 112b outputs high-speed test data TH to the calculator 131 of the probe 13. The signal reception verifier 112c confirms whether a reception confirmation signal Sd output from the calculator 131 of the probe 13 has been received. The addition value calculator 112d calculates an addition value M based on a value showing test results stored in a memory. The addition value determiner 112e compares the addition value M and a reception count determination value Mth.

Figure 5:
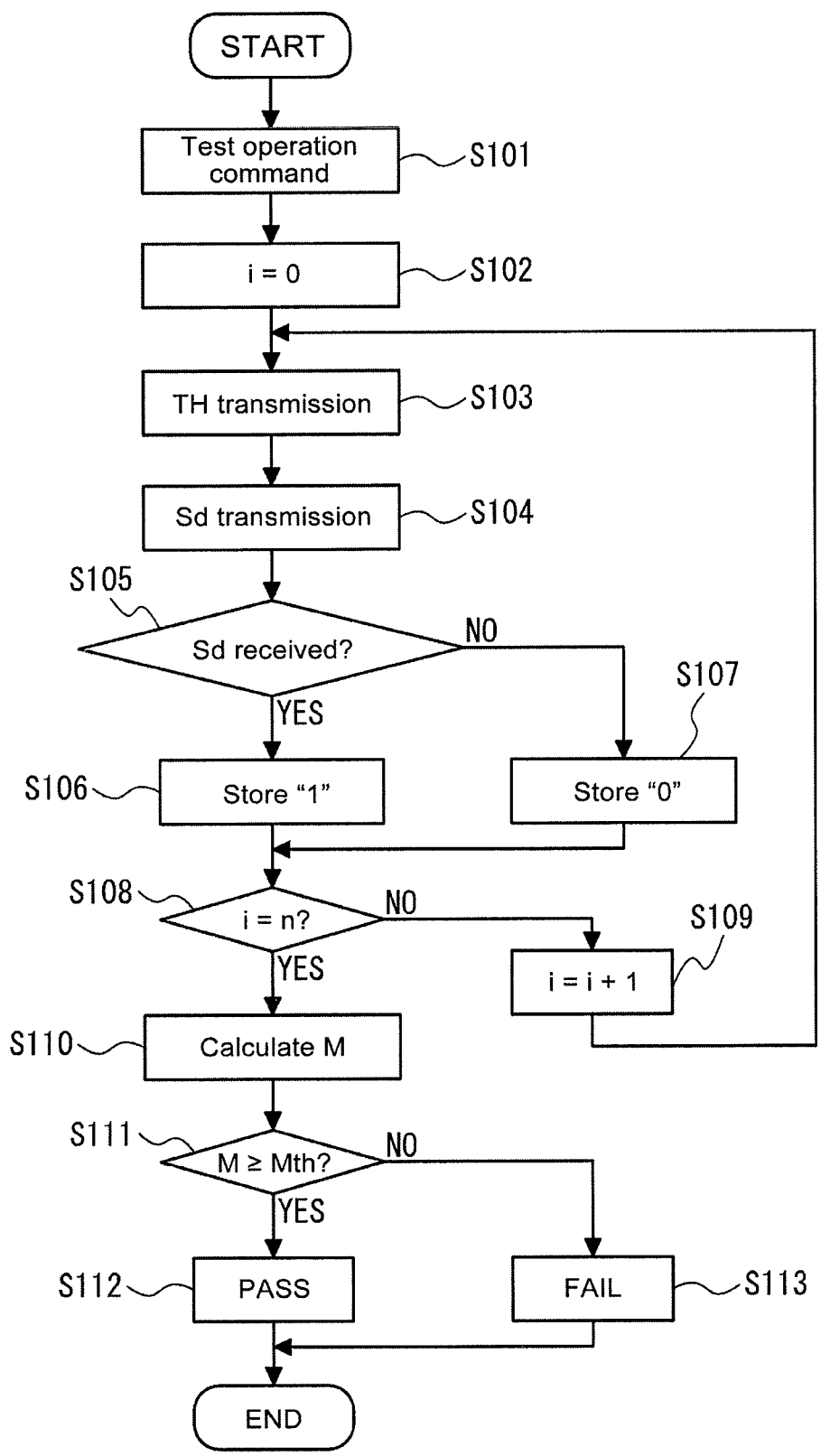
FIG. 5 is a flow chart illustrating a test operation for impedance in a cable of the shape measuring instrument 100 according to Embodiment 1.

Next, a description is given of the test operation for impedance in the cable of the coordinate measuring device according to the present embodiment. FIG. 5 is a flow chart illustrating the test operation for impedance in the cable of the shape measuring instrument 100 according to Embodiment 1.

First, before beginning measurement with the coordinate measuring device 101, the host computer 120 issues a command to the calculator 112 of the probe interface 110 to execute a test operation (step S101).

The count value controller 112a resets a count value i of the counter 113 to "0" (step S102).

The test data outputter 112b transfers the high-speed test data TH to the calculator 131 of the probe 13 (step S103).

When the high-speed test data TH is received normally, the calculator 131 of the probe 13 transmits the reception confirmation signal Sd to the signal reception verifier 112c of the probe interface 110 (step S104). Meanwhile, when the high-speed test data TH cannot be received normally, the reception confirmation signal Sd is not transmitted from the calculator 131 of the probe 13.

The signal reception verifier 112c confirms whether the reception confirmation signal Sd is received (step S105). For example, the signal reception verifier 112c waits a predetermined amount of time after transmission of the high-speed test data TH, then determines whether the reception confirmation signal Sd is received.

When the reception confirmation signal Sd has been received, the signal reception verifier 112c stores information for "1" in the memory 114, indicating successful reception (step S106). When the reception confirmation signal Sd is not received, the signal reception verifier 112c stores information for "0" in the memory 114, indicating failed reception (step S107).

The count value controller 112a determines whether the value i defined by the counter is equal to a test data transmission count definition value N (where N is any integer equal to or greater than 1) (step S108).

When i≠N, the counter 113 adds 1 to i according to a command from the count value controller 112a (step S109).

When i=N, the addition value calculator 112d adds the value stored in the memory 114 and calculates the addition value M according to a command from the count value controller 112a (step S110). Thereby, the calculator 112 identifies a number of times reception was determined to be successful in step S106.

The addition value determiner 112e compares the addition value M and the reception count determination value Mth (step S111). The reception count determination value Mth is an integer satisfying the expression $1 \leq Mth \leq N$ and is a value expressing a required number of times that reception is possible in order to determine that there is no increase in impedance. The reception count determination value Mth is stored in the memory 114 and can be read by the addition value determiner 112e when appropriate, for example.

When M≥Mth, transmission of the high-speed test data TH is treated as being in a state where normal transmission is possible and the addition value determiner 112e outputs a pass determination (step S112). When M<Mth, transmission of the high-speed test data TH is treated as being in a state where normal transmission is not possible (i.e., impedance in the cable is treated as increased), and the addition value determiner 112e outputs a fail determination (step S113).

The addition value determiner 112e outputs the pass determination and the fail determination noted above to the host computer 120. When the fail determination is received, the host computer 120 displays an alarm on an output device recommending that the cable be replaced.

Given the above, according to the above-noted configuration and method, increased impedance can be detected in a cable repeatedly bent by repeated measurements that use the coordinate measuring device. Moreover, setting a communication speed of the high-speed test data TH noted above to be higher than a communication speed during shape measurement enables a test in which a margin is maintained with respect to the communication speed during shape measurement. In other words, by performing a test under stricter conditions than those of the shape measurement, the cable can be replaced before the increased impedance affects the shape measurement. In addition, when the communication speed of the shape measurement is 140 Mbps, the communication speed of the high-speed test data TH is 160 Mbps, for example.

In the coordinate measuring device, after the cable is replaced, adjustment of position accuracy and the like becomes necessary. Therefore, a corresponding amount of time is required for the work to replace the cable. Thus, unplanned equipment stoppages are caused when the cable is replaced only after the increased impedance in the cable progresses and the shape measurement becomes impossible. However, according to the present configuration, the increased impedance is detected and an alarm is given before the shape measurement becomes impossible. Therefore, a planned cable replacement can be performed. Thereby, by incorporating the cable replacement into plans for equipment usage, unexpected equipment stoppages can be prevented and efficient plans for shape measurement can be formulated.

Embodiment 2

Figure 6:
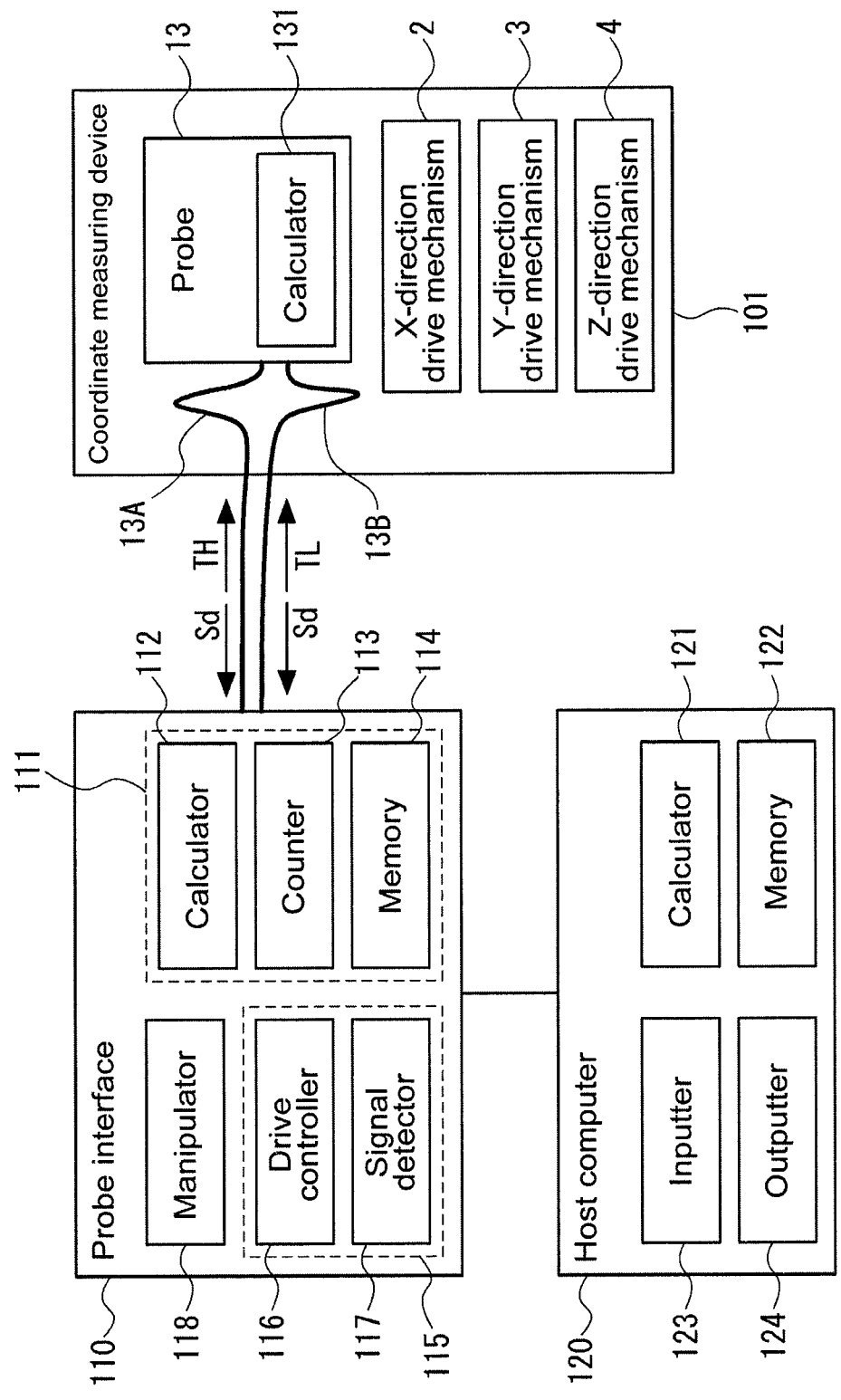
FIG. 6 is a block diagram schematically illustrating a configuration of a shape measuring instrument 200 according to Embodiment 2.

Next, a description is given of a shape measuring instrument 200 according to Embodiment 2. FIG. 6 is a block diagram schematically illustrating a configuration of the shape measuring instrument 200 according to Embodiment 2. The shape measuring instrument 200 has an additional cable 13B, as compared to the shape measuring instrument 100. The cable 13B is connected between the probe interface 110 and the probe 13. The cable 13B is a cable for performing communication at a lower speed than the cable 13A. Other configurations of the shape measuring instrument 200 are similar to those of the shape measuring instrument 100 and descriptions thereof are therefore omitted.

Figure 7:
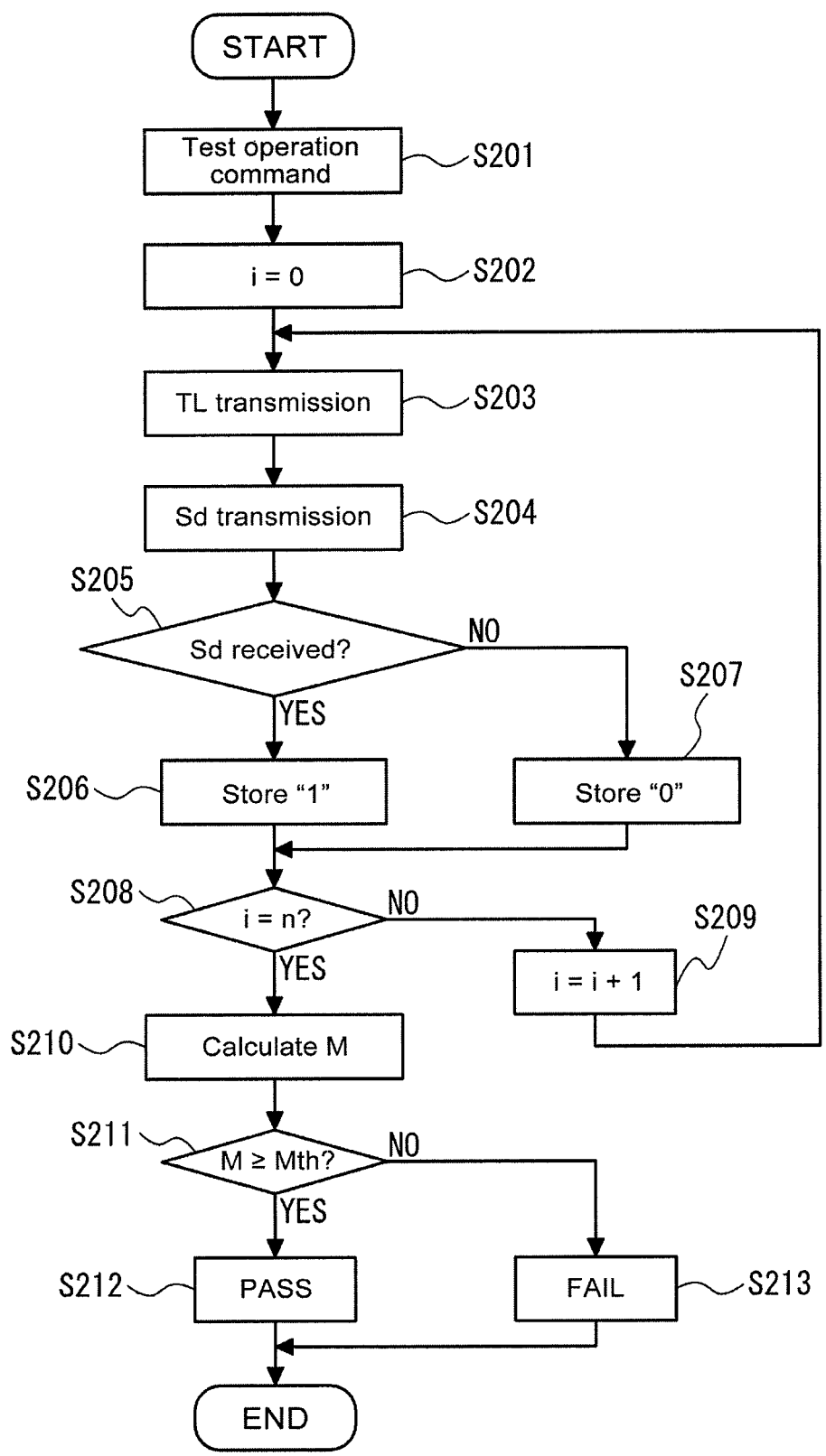
FIG. 7 is a flow chart illustrating a test operation for impedance in a cable 13B of the shape measuring instrument 200 according to Embodiment 2.

Next, a description is given of a test operation for impedance in the cable of the coordinate measuring device according to the present embodiment. Similar to the shape measuring instrument 100, the shape measuring instrument 200 can perform the test operation for impedance using the high-speed test data TH through the cable 13A. Moreover, the shape measuring instrument 200 can perform the test operation for impedance using low-speed test data TL through the cable 13B. FIG. 7 is a flow chart illustrating the test operation for impedance in the cable 13B of the shape measuring instrument 200 according to Embodiment 2.

Steps S201 and S202 in FIG. 7 are similar to steps S101 and S102 of FIG. 5, respectively, and descriptions thereof are therefore omitted.

After step S202, the test data outputter 112b transfers the low-speed test data TL to the calculator 131 of the probe 13 (step S203).

Subsequent steps S203 to S213 in FIG. 7 are similar to steps S103 to S113 in FIG. 5, respectively, and descriptions thereof are therefore omitted.

In other words, similar to the cable 13A, by transmitting the low-speed test data TL through the cable 13B, the test operation for impedance in the cable 13B can be executed. Moreover, when the communication speed of a signal propagated through the cable 13B during the shape measurement is 6 kbps, the communication speed of the low-speed test data TL is 7 kbps, for example.

According to the above configuration, even when a plurality of cables having different communication speeds are included, the test operation for impedance can be performed on each of the cables. Moreover, in the present embodiment, a situation was described having two cables, 13A and 13B; however, a number of cables may of course be three or any other number desired.

Embodiment 3

Figure 8:
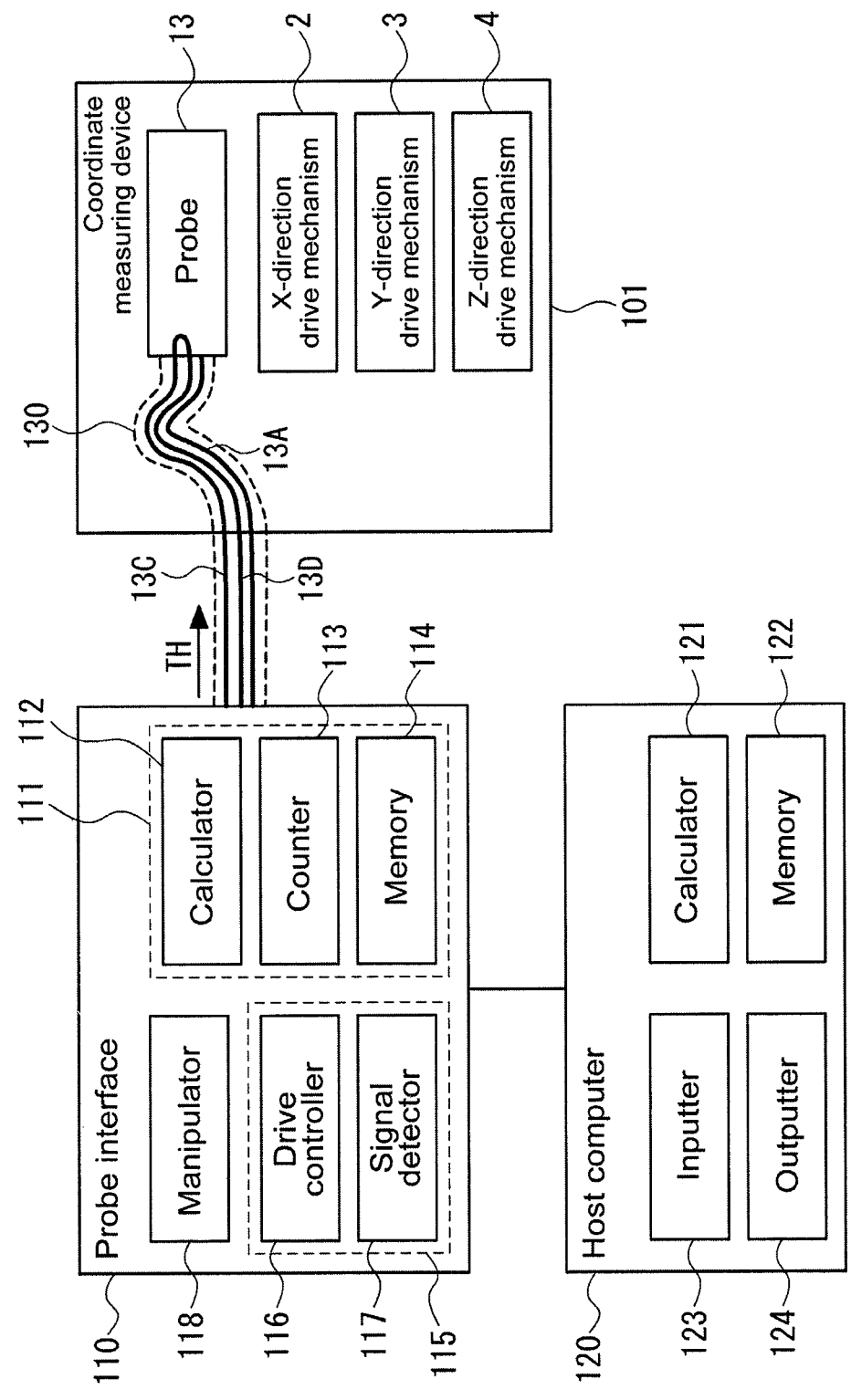
FIG. 8 is a block diagram schematically illustrating a configuration of a shape measuring instrument 300 according to Embodiment 3.

Next, a description is given of a shape measuring instrument 300 according to Embodiment 3. FIG. 8 is a block diagram schematically illustrating a configuration of the shape measuring instrument 300 according to Embodiment 3. The shape measuring instrument 300 has additional cables 13C and 13D, as compared to the shape measuring instrument 100. The cables 13C and 13D are connected between the probe interface 110 and the probe 13. The cables 13C and 13D are short-circuited on the interior of the probe 13.

In addition, the cables 13A, 13C, and 13D are gathered together as a single bundled cable 130. Accordingly, the cables 13A, 13C, and 13D travel along the same pathway, and thus are repeatedly bent the same number of times and to the same degree by repeated shape measurements.

Figure 9:
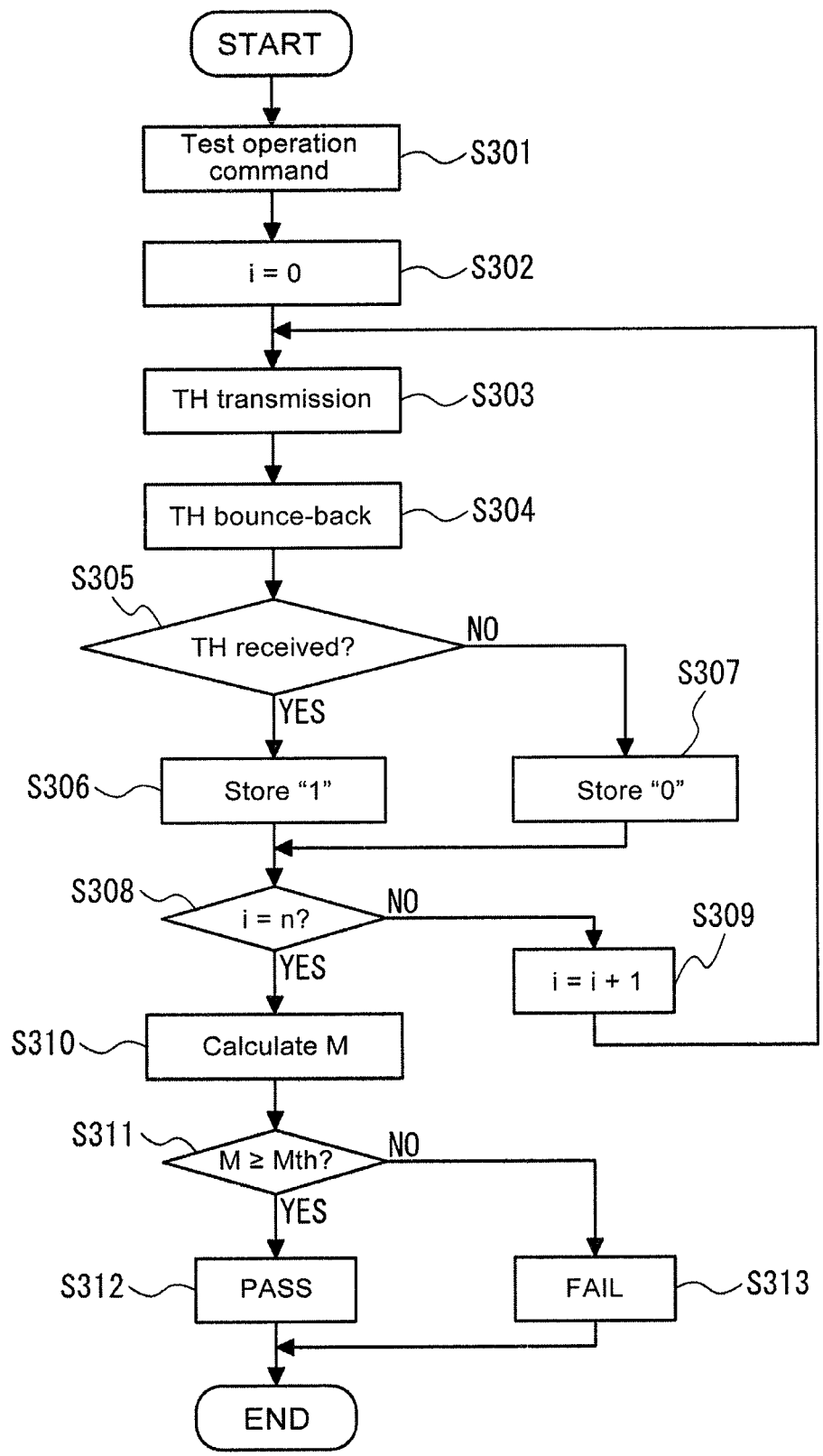
FIG. 9 is a flow chart illustrating a test operation for impedance in cables of the shape measuring instrument 300 according to Embodiment 3.

Next, a description is given of the test operation for impedance in the cable of the coordinate measuring device of the present embodiment. Using the cables 13C and 13D, the shape measuring instrument 300 can perform the test operation for impedance using the high-speed test data TH. FIG. 9 is a flow chart illustrating the test operation for impedance in the cables of the shape measuring instrument 300 according to Embodiment 3.

Steps S301 and S302 in FIG. 9 are similar to steps S101 and S102 in FIG. 5, respectively, and descriptions thereof are therefore omitted.

After step S302, the test data outputter 112b transfers the high-speed test data TH to the probe 13 of the coordinate measuring device 101 through the cable 13C (step S303).

The cables 13C and 13D are short-circuited on the interior of the probe 13, and therefore the high-speed test data TH is bounced back, propagated through the cable 13D, then returns to the probe interface 110 (step S304). In other words, the high-speed test data TH is transmitted to the probe interface 110 as the reception confirmation signal Sd shown in FIG. 3. At this point, when the impedance in at least one of the cables 13C and 13D is large, the high-speed test data TH is unable to return to the probe interface 110 in a normal state.

The signal reception verifier 112c confirms whether the high-speed test data TH was received normally (step S305). For example, the signal reception verifier 112c waits a predetermined amount of time after transmission of the high-speed test data TH, then determines whether the high-speed test data TH is received normally.

When the high-speed test data TH is received normally, the signal reception verifier 112c stores information for "1" in the memory 114, indicating successful reception (step S306). When the high-speed test data TH is not received normally, the signal reception verifier 112c stores information for "0" in the memory 114, indicating failed reception (step S307).

Subsequent steps S308 to S311 in FIG. 9 are similar to steps S108 to S111 in FIG. 5, respectively, and descriptions thereof are therefore omitted.

After step S311, when M≥Mth, transmission of the high-speed test data TH is determined to be in a state where normal transmission is possible. In addition, the test results using the cables 13C and 13D are treated as identical to the test results of the cable 13A, and the addition value determiner 112e outputs a pass determination (step S312). When M<Mth, transmission of the high-speed test data TH is determined to be in a state where normal transmission is not possible (i.e., impedance in the cables is treated as increased), and the test results using the cables 13C and 13D are treated as identical to the test results of the cable 13A, and the addition value determiner 112e outputs a fail determination (step S313).

As noted above, the cables 13A, 13C, and 13D travel along the same pathway, and thus are repeatedly bent the same number of times and to the same degree by repeated shape measurements. Accordingly, with the present configuration, by performing the test operation for impedance using the cables 13C and 13D, the increased impedance in the cable 13A can be indirectly estimated, the cable 13A being used in communication of data during the shape measurement. Thus, the shape measuring instrument 300 can perform the same test operation for impedance in the cable as the shape measuring instrument 100.

Moreover, as compared to the shape measuring instrument 100, the shape measuring instrument 300 can omit the calculator 131 of the probe 13. Thus, the shape measuring instrument 300 contributes to reduced size and cost of probes.

Embodiment 4

Figure 10:
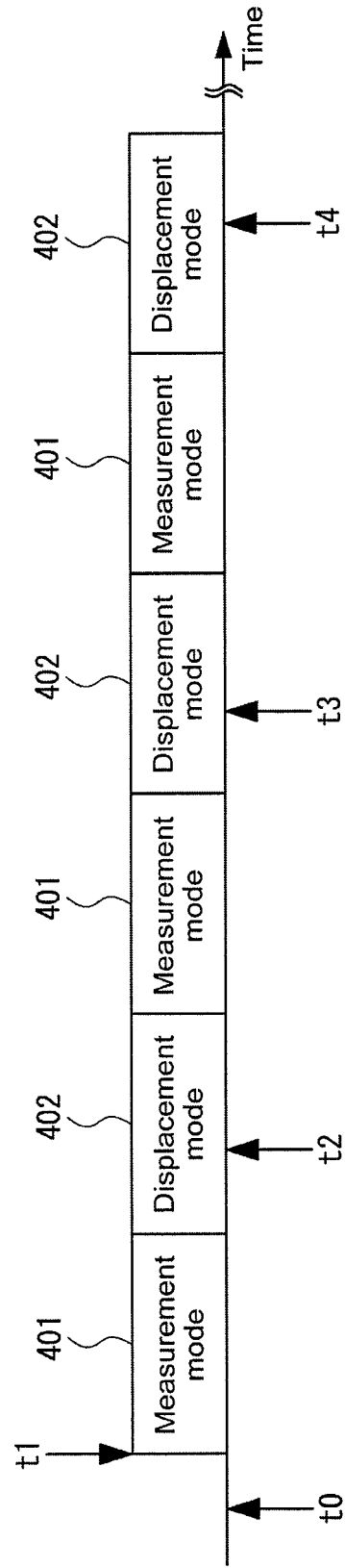
FIG. 10 illustrates an operation mode of a shape measuring instrument 400 according to Embodiment 4 during shape measurement.

Next, a description is given of a shape measuring instrument 400 according to Embodiment 4. The shape measuring instrument 400 is a modification of the shape measuring instrument 100 according to Embodiment 1. The shape measuring instrument 400 performs the test operation for impedance in sequential cables not only before beginning measurement, but also during a probe displacement operation during the shape measurement. FIG. 10 illustrates an operation mode of the shape measuring instrument 400 according to Embodiment 4 during shape measurement.

Prior to beginning the shape measurement (time stamp t1 in FIG. 10), the shape measuring instrument 400 executes the test operation for impedance in the cables (time stamp t0 in FIG. 10), similar to the shape measuring instrument 100. Thereafter, when the shape measurement begins, a measurement mode 401 and a displacement mode 402 are repeated. In the measurement mode 401, the probe is displaced to actually follow the shape of the work piece to perform the measurement. In the displacement mode 402, the probe is displaced between measurement locations without performing the shape measurement. The shape measuring instrument 400 performs the test operation for impedance in sequential cables during the displacement mode 402 (time stamps t2 to t4 in FIG. 10).

According to the present configuration, increased impedance in sequential cables can be observed not only before beginning the shape measurement but also during the shape measurement. Accordingly, the shape measuring instrument 400 can ensure reliability of the shape measurement as compared to the shape measuring instrument 100.

Moreover, the present invention is not limited to the embodiment described above, and may be modified as needed without departing from the scope of the present invention. For example, the test operation for impedance in the cables using the low-speed test data TL according to the shape measuring instrument 200 can, of course, be applied to the shape measuring instruments 300 or 400.

For example, the test operation for impedance in the cables during the displacement mode 402 according to the shape measuring instrument 400 can, of course, be executed in the shape measuring instrument 300 as well.

The above-described embodiments described shape measuring instruments; however, such descriptions are exemplary. Accordingly, the present invention can be applied to measurement devices other than shape measuring instruments, or to devices other than measurement devices, such as industrial machinery and equipment having a movable portion with a bent portion and which displace the bent portion according to displacement of the movable portion.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. A shape measuring instrument comprising:
   a measurer having a movable detector configured to detect a shape of a measured object and further configured to output a signal indicating results of the shape detection;
   a controller configured to receive the signal indicating the results of the shape detection; and
   a cable configured to transmit the signal indicating the results of the shape detection between the movable detector and the controller, and further configured to bend in accordance with displacement of the movable detector, wherein:
   the controller comprises an impedance detector configured to detect impedance in the cable, the impedance detector comprising a calculator configured to detect the impedance in the cable according to whether a reception confirmation signal is received through the cable, the reception confirmation signal being output from the movable detector when test data is transmitted through the cable to the movable detector and the movable detector receives the test data.

2. The shape measuring instrument according to claim 1, wherein the calculator is further configured to:
   output the test data to the movable detector N times (where N is an integer equal to or greater than 1);
   output a pass determination when the reception confirmation signal is received at least M times (where M is an integer equal to or greater than 1 and equal to or less than N); and
   output a fail determination when the reception confirmation signal is received less than M times (where M is an integer equal to or greater than 1 and equal to or less than N).

3. The shape measuring instrument according to claim 2, wherein the impedance detector further comprises:
   a counter configured to control a number of times the test data output from the calculator is output; and
   a memory configured to store information indicating a number of times the reception confirmation signal output from the calculator is received.

4. The shape measuring instrument according to claim 3, wherein the calculator comprises:
   a test data outputter configured to output the test data to the movable detector;
   a signal reception verifier configured to confirm whether the reception confirmation signal is received;
   a count value controller configured to control a value defined by the counter;
   a reception calculator configured to calculate the number of times the reception confirmation signal is received; and
   a determiner configured to determine whether the number of times the reception confirmation signal is received is equal to or greater than M based on the information stored in the memory.

5. The shape measuring instrument according to claim 1, wherein a communication speed of the test data transmitted from the controller, through the cable, and to the movable detector is faster than a communication speed of a signal transmitted from the movable detector, through the cable, and to the controller when performing a shape measurement.

6. The shape measuring instrument according to claim 1, wherein:
the cable comprises a plurality of cables,
the communication speed of the signal indicating the results of the shape detection transmitted from the movable detector, through the plurality of cables, and to the calculator differs for each of the plurality of cables, and
the communication speed of the test data transmitted from the calculator, through the plurality of cables, and to the movable detector differs for each of the plurality of cables.

7. The shape measuring instrument according to claim 1, wherein:
the cable comprises a bundled cable including first through third cables,
the signal indicating the results of the shape detection is transmitted from the movable detector, through the first cable, and to the calculator,
the test data is transmitted from the calculator, through the second cable, and to the movable detector,
a connection end of the second cable on the movable detector side and a connection end of the third cable on the movable detector side are short-circuited,
the test data is transmitted from the movable detector, through the second cable, and to the calculator as the reception confirmation signal, and
impedance detection results for the second and third cables are output as impedance results for the first cable.

8. The shape measuring instrument according claim 1, wherein the calculator is configured to detect the impedance in the cable before the measurer begins a shape measurement operation.

9. The shape measuring instrument according to claim 8, wherein the calculator is configured to detect the impedance in the cable after the measurer begins the shape measurement operation, during a time when the movable detector is displaced from a first measurement position to a second measurement position without performing shape measurement.

10. An impedance detector comprising:
a calculator configured to output test data through a cable to a movable portion of an instrument having the movable portion, the movable portion configured to output a signal indicating results of an operation, wherein:
the cable is configured to bend in accordance with displacement of the movable portion,
the calculator is configured to detect impedance in the cable according to whether a reception confirmation signal output when the movable portion receives the test data is confirmed to be received through the cable.

11. The impedance detector according to claim 10, wherein the calculator is configured to:
output the test data to the movable portion N times (where N is an integer equal to or greater than 1)
output a pass determination when the reception confirmation signal is received at least M times (where M is an integer equal to or greater than 1 and equal to or less than N), and
output a fail determination when the reception confirmation signal is received less than M times (where M is an integer equal to or greater than 1 and equal to or less than N).

12. The impedance detector according to claim 11, wherein the impedance detector further comprises:
a counter configured to control a number of times the test data output from the calculator is output; and
a memory configured to store information indicating a number of times the reception confirmation signal output from the calculator is received.

13. The impedance detector according to claim 12, wherein the calculator comprises:
a test data outputter configured to output the test data to the movable portion;
a signal reception verifier configured to confirm whether the reception confirmation signal is received;
a count value controller configured to control a value defined by the counter;
a reception calculator configured to calculate a number of times the reception confirmation signal is received; and
a determiner configured to determine whether the number of times the reception confirmation signal is received is equal to or greater than M based on the information stored in the memory.

14. The impedance detector according to claim 10, wherein a communication speed of the test data transmitted from the calculator, through the cable, and to the movable portion is faster than a communication speed of the signal indicating the results of the operation and transmitted from the movable portion, through the cable, and to the controller of the instrument having the movable portion.

15. The impedance detector according to claim 10, wherein:
the cable comprises a plurality of cables,
the communication speed of the signal indicating the results of the operation and transmitted from the movable portion, through the plurality of cables, and to the controller of the instrument having the movable portion differs for each of the plurality of cables, and
the communication speed of the test data transmitted from the controller, through the plurality of cables, and to the movable portion differs for each of the plurality of cables.

16. The impedance detector according to claim 10, wherein the cable comprises a bundled cable including first through third cables,
the signal indicating results of shape detection is transmitted from the movable portion, through the first cable, and to the calculator,
the test data is transmitted from the calculator, through the second cable, and to the movable portion,
a connection end of the second cable on the movable portion side and a connection end of the third cable on the movable portion side are short-circuited,
the test data is transmitted from the movable portion, through the second cable, and to the calculator as the reception confirmation signal, and
impedance detection results for the second and third cables are output as impedance results for the first cable.

17. The impedance detector according to claim 10, wherein the calculator is configured to detect the impedance in the cable before the movable portion begins an operation outputting the signal indicating the results of the operation.

18. The impedance detector according to claim 17, wherein the calculator is configured to detect the impedance in the cable after the movable portion begins the operation outputting the signal indicating the results of the operation, during a time when the movable portion is displaced from a first measurement position to a second measurement position without outputting the signal indicating the results of the operation.

19. An impedance detection method comprising:
outputting test data through a cable to a movable portion of an instrument having the movable portion, the movable portion outputting a signal indicating results of an operation and the cable being bent in accordance with displacement of the movable portion;
confirming whether a reception confirmation signal is received, the signal being output when the movable portion receives the test data; and detecting impedance in the cable according to a result of the confirmation.

20. The impedance detection method according to claim 19 comprising:
outputting the test data to the movable portion N times (where N is an integer equal to or greater than 1);
outputting a pass determination when the reception confirmation signal is received at least M times (where M is an integer equal to or greater than 1 and equal to or less than N); and
outputting a fail determination when the reception confirmation signal is received less than M times (where M is an integer equal to or greater than 1 and equal to or less than N).

21. The impedance detection method according to claim 19, wherein a communication speed of the test data transmitted through the cable to the movable portion is faster than a communication speed of the signal indicating the results of the operation and transmitted from the movable portion through the cable.

22. The impedance detection method according to claim 19, wherein:
the cable is a plurality of cables,
the communication speed of the signal indicating the results of the operation and transmitted from the movable portion through the plurality of cables differs for each of the plurality of cables, and
the communication speed of the test data transmitted through the plurality of cables to the movable portion differs for each of the plurality of cables.

23. The impedance detection method according to claim 19, wherein:
the cable is a bundled cable including first through third cables,
a signal indicating results of shape detection is transmitted from the movable portion through the first cable,
the test data is transmitted through the second cable to the movable portion,
a connection end of the second cable on the movable portion side and a connection end of the third cable on the movable portion side are short-circuited,
the test data is transmitted from the movable portion through the second cable as the reception confirmation signal, and
impedance detection results for the second and third cables are output as impedance results for the first cable.

24. The impedance detection method according to claim 19, wherein the impedance in the cable is detected before the movable portion begins an operation outputting the signal indicating the results of the operation.

25. The impedance detection method according to claim 24, wherein the impedance in the cable is detected after the movable portion begins the operation outputting the signal indicating the results of the operation, during a time when the movable portion is displaced from a first measurement position to a second measurement position without outputting the signal indicating the results of the operation.

* * * * *